(12) United States Patent
Maloney

(10) Patent No.: US 7,541,889 B2
(45) Date of Patent: Jun. 2, 2009

(54) PULSE COUPLING APPARATUS, SYSTEMS, AND METHODS

(75) Inventor: Timothy J. Maloney, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 1262 days.

(21) Appl. No.: 10/608,469

(22) Filed: Jun. 26, 2003

(65) Prior Publication Data

US 2004/0264081 A1 Dec. 30, 2004

(51) Int. Cl.
*H01P 1/10* (2006.01)
*G01R 27/26* (2006.01)

(52) U.S. Cl. .................. 333/101; 333/109; 324/678
(58) Field of Classification Search .......... 333/109, 333/115
See application file for complete search history.

(56) References Cited

U.S. PATENT DOCUMENTS

| | | | |
|---|---|---|---|
| 3,710,282 A | 1/1973 | Seinecke | |
| 4,081,768 A | 3/1978 | Voss et al. | |
| 4,618,838 A | 10/1986 | Kajiwara et al. | |
| 5,519,327 A | 5/1996 | Consiglio | 324/678 |
| 5,568,105 A | 10/1996 | O'Leary et al. | |
| 5,638,402 A | 6/1997 | Osaka et al. | |
| 5,675,260 A * | 10/1997 | Consiglio | 324/763 |
| 5,804,977 A | 9/1998 | Consiglio | 324/678 |
| 6,054,907 A | 4/2000 | Sjogren | |
| 6,429,674 B1 * | 8/2002 | Barth et al. | 324/763 |
| 6,570,388 B2 * | 5/2003 | Lee et al. | 324/457 |
| 6,924,651 B2 | 8/2005 | Osaka et al. | |
| 2003/0006721 A1 * | 1/2003 | Kinbara et al. | 315/363 |

OTHER PUBLICATIONS

"HUM2020 Pin Diode", http://www.microsemi.com/datasheets/MSC0874.pdf, (2000), 1-5.
"Picosecond Pulse Labs: Models 5208, 5210, 5212A, 5214 Impulse Forming Networks", http://www.picosecond.com/products/category.asp?pd_id=16, (Jun. 23, 2003), 6 pages.
Cohn, S G., "The re-entrant cross section and wide-band 3-db hybrid couplers", *IEEE Trans. Microwave Theory and Techniques, vol. MTT-11*, (Jul. 1963), 254-258.
ESD Association, "Transmission Line Pulsing", *ESDA Standards WG 5.5 Draft*, (2003), 1-14.
Gieser, H , et al., "Very fast transmission line pulsing of integrated structures and the charged device model", *IEEE Transactions on Components, Packaging, and Manufacturing Technology, Part C*, 21(4), (Oct. 1998), 278-285.

(Continued)

*Primary Examiner*—Benny Lee
*Assistant Examiner*—Alan Wong
(74) *Attorney, Agent, or Firm*—Schwegman, Lundberg & Woessner, P.A.

(57) ABSTRACT

Apparatus and systems, as well as methods for using them, may include launching a pulse into an input port of a quarter-wave directional coupler having an thru port and an isolated port, and receiving a leading edge of the pulse as a voltage spike at an output port of the coupler. A switch may be activated to couple a pulse source to the input port. The impedance of the coupler may be selected to match the resistance of the switch added to the impedance of a charge line included in the pulse source.

18 Claims, 6 Drawing Sheets

OTHER PUBLICATIONS

Maloney, T., et al., "Transmission Line Pulsing Technique for Circuit Modeling", *1985 EOS/ESD Symposium Proceedings*, (1985), 49-54.

Matthaei, George L., et al., "Microwave filters, impedance-matching networks, and coupling structures", *New York, McGraw-Hill*, (1964), 778-779.

"Eagleware PN 13—Electrical to Physical with Advanced TLINE—Product Note", Eagleware Corporation, Norcross, GA, http://www.eagleware.com/pdf/apps/0013_AdvancedTLINE.pdf, (Jan. 2002), 1-7.

"Power Dividers and Directional Couplers", *Wikipedia—the Free Encyclopedia* [online]. [retrieved on Nov. 9, 2006]. Retrieved from the Internet: <http://en.wikipedia.org/wiki/Directional_coupler>, 1-9.

Henry, L., et al., "Transmission-Line Pulse ESD Testing of ICs: A New Beginning", [online]. [retrieved on Jan, 18, 2007]. Retrieved from the Internet: <http://www.ce-mag.com/ce-mag.com/archive/01/03/0103CE_046.html>, 1-12.

Schauwecker, B., et al., "RF-MEMS Components for Broadband Applications", [online]. [retrieved on Apr. 2003]. Retrieved from the Internet: <http://www.empire.de/main/Empire/pdf/publications/2003/ws-s_sirf2003.pdf>, (Apr. 2003), 1-4.

Simon, W., et al., "EM Design of an Isolated Coplanar RF Cross for MEMS Switch Matrix Applications", *Digest of Papers. 2003 Topical Meeting on Silicon Monolithic Integrated Circuits in RF Systems*, (2003), 1-4.

\* cited by examiner

PULSE COUPLING APPARATUS, SYSTEMS, AND METHODS

TECHNICAL FIELD

The subject matter disclosed relates generally to apparatus, systems, and methods used to conduct energy from one location to another, including electrical conductors and filters.

BACKGROUND INFORMATION

Circuitry tested under the charged device model (CDM) is typically subjected to simulated electrostatic discharge (ESD) pulses using an automated CDM testing process. Failures may be investigated by continuously cycling components through a large, expensive automated CDM tester. This tedious process is often conducted for each type of CDM stress as failure analysis proceeds. The results are typically not subject to decomposition with respect to the condition and capabilities of major circuit nodes (e.g., power supply input, ground, etc.).

Transmission line pulse (TLP) testing methods have been developed, and can be used as a more finely-tuned mechanism to determine failure modes for individual nodes. However, TLP testing hardware is usually delicate and expensive. Thus, there is a need in the art for a less expensive apparatus, systems, and methods to conduct CDM testing, as well as to cross-check the results provided by automated CDM testing machines.

DETAILED DESCRIPTION

Figure 1:
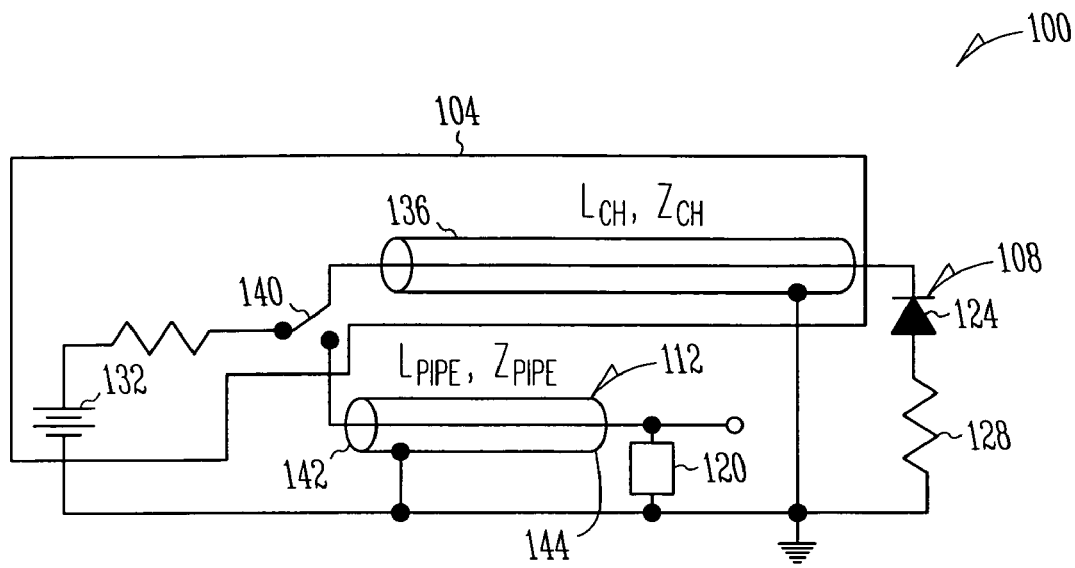
FIG. 1 is a schematic block diagram of a system according to various embodiments.

In the following detailed description of various embodiments, reference is made to the accompanying drawings that form a part hereof, and in which are shown by way of illustration, and not of limitation, specific embodiments in which the subject matter may be practiced. In the drawings, like numerals describe substantially similar components throughout the several views. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. The following detailed description, therefore, is not to be taken in a limiting sense.

FIG. 1 is a schematic block diagram of a system 1100 according to various embodiments. Such a system 100, which may comprise a pulse source 104, a pulse source load 108, a connecting line 112, and an output load 120 (e.g., a device under test), may enable the use of large amounts of current (e.g., greater than about 10 A), packaged as a narrow voltage pulse (e.g., less than or equal to 2 nanoseconds in length), to be used in determining whether a particular output load 120 (e.g., a particular component or device under test) will survive CDM testing.

Increasing the amount of current provided by TLP testing (especially for short CDM-like pulses) may entail impedance matching either the pulse source or the load in order to avoid multiple reflections. While matching the load is possible, this approach may limit the available peak current if the load is made insensitive to the unmatched device. Thus, matching the source 104 using a pulse source load 108, including a polarized matched load (PML) having a diode 124 and a resistance 128, may be more useful.

The pulse source 104 can be implemented in a number of ways, including a commercially-supplied pulse source, such as the Barth Electronics Model 632 Picosecond Pulse Generator. The pulse source 104 may also comprise a power source 132, such as a voltage source or a current source coupled to a charge line 136 and a switch 140, as shown in FIG. 1. For example, some implementations of a PML 108 may provide currents of 20 A or more in a 50-ohm system using a 2 kV charge line 136. Thus, it may be useful to consider some details of the switch 140 being used to connect the charge line 136 to the output load 120.

The diode 124—resistor 128 combination may be used to terminate opposite polarity waves reflected from output loads 120 having an impedance less than the charge line 136 characteristic impedance, often about 50 ohms. Thus, the PML 108 can be a mechanism for impedance matching the pulse source 104 so that reflections are absorbed.

The switch 140 may form an arc as the contacts close and open. Experimentation has shown that the arc may comprise resistance (because its plasma can dissipate power) and that the arc may have its own current-voltage-time behavior. Since the arc may be placed in series with the charge line 136 and the connecting line 112, it can be considered as part of the system 100 for the forward and reflected waves, especially when attempts are made to match the pulse source 104 impedance. For example, if the switch 140 comprises an Aleph ZH1A05NZ mercury coaxial radio frequency (RF) relay, there may be about 10 ohms of switch arc resistance. If the switch 140 comprises a Tohtsu CX-230 single-pole, double-throw (SPDT) coaxial switch, the arc resistance may be about 16 ohms.

Using an SPDT switch 140 may serve to avoid recharge pulses that can occur when there is sufficient time for the charge line 136 to recharge before the switch 140 is fully closed. For example, if a connecting line 112 (of length $L_{pipe}$ and impedance $Z_{pipe}$) is used in the system 100, the impedance balancing situation at switch closure may include a division between a series combination of the switch resistance (including arc resistance) $R_{sw}$, the impedance of the charge line $Z_{ch}$, and the impedance of the connecting line $Z_{pipe}$. When the impedance of the connecting line $Z_{pipe}$ substantially matches the sum of the switch resistance $R_{sw}$ and the charge line impedance $Z_{ch}$, the charge line impedance $Z_{ch}$ is not matched to the switch resistance $R_{sw}$ plus the connecting line impedance $Z_{pipe}$. However, waves reflected from a low impedance output load 120 can be matched into the switch 140 plus the charge line 136 and terminated by the PML 108. The result will usually be a pulse delivered to the output load 120 that includes a well-defined leading edge and an imperfect (i.e., rounded, not sharp) trailing edge, unless $R_{sw}$ is small. This may be quite acceptable for relatively long pulses (e.g., 50-100 nsec or longer).

Achieving various values of line impedances $Z_{pipe}$ and $Z_{ch}$ is not difficult. For example, if $Z_{pipe}$=50 ohms, it has been determined that using a tee connection to two transmission lines for $Z_{ch}$ can be effective. Two 75 ohm lines connected in this manner gives $Z_{ch}$=37.5 ohms, a 50 ohm and a 75 ohm line gives 30 ohms, and so on. Together with the switch resistance $R_{sw}$, such parallel lines may be found to match the impedance of a 50-ohm line fairly well.

An alternative way of describing the illustrated embodiment includes a system 100 comprising a charge line 136 coupled to a pulse source load 108 and capable of being coupled to a power source 132. The power source 132 may be a high voltage source, defined herein to mean a source of greater than about 100 volts of potential difference. Wherever a high voltage source is noted herein, a very high voltage source may also be substituted. As defined herein, a very high voltage source is a source of greater than about 500 volts of potential difference.

The system 100 may also include a connecting line 112 having a first end 142 DC-coupled to a second end 144 capable of being coupled to the output load 120. The system 100 may also include a switch 140 to couple the charge line 136 to the first end 142 when in a first position, and to decouple the charge line 136 from the first end 142 when in a second position, wherein the connecting line 112 may have a selected impedance (e.g., $Z_{pipe}$) based on a resistance (e.g., $R_{sw}$) of the switch 140 and an impedance (e.g., $Z_{ch}$) of the charge line 136.

The selected impedance (e.g., $Z_{pipe}$) may be substantially equal to the sum of the resistance of the switch (e.g., $R_{sw}$) and the impedance (e.g., $Z_{ch}$) of the charge line 136. In addition, or alternatively, a sum of the selected impedance (e.g., $Z_{pipe}$) and the resistance (e.g., $R_{sw}$) of the switch 140 may be less than or substantially equal to an impedance (e.g., $Z_{ch}$) of the charge line 136.

The switch 140 may comprise an SPDT switch, and may be used to couple the charge line 136 to the power source 132 when the switch 140 is in the second position. Alternatively, the switch 140 may comprise a single-pole, single-throw switch (SPST), and may be connected so that the charge line 136 remains coupled to the power source 132 when the switch 140 is in either the first position or the second position. The switch 140 resistance (e.g., $R_{sw}$) may comprise the switch arc resistance. As noted above, the pulse source load 108 may comprise a polarized matching load.

For short input pulses (e.g., less than about 50 nsec duration), the embodiments described may result in coupled pulses having relatively long trailing edges. To reduce the amount of such distortion (i.e., the length of the trailing edge), an additional load may be used so that impedance-matching occurs on each side of the switch 140, that is, for both the connecting line 112 and the charge line 136.

Figure 2:
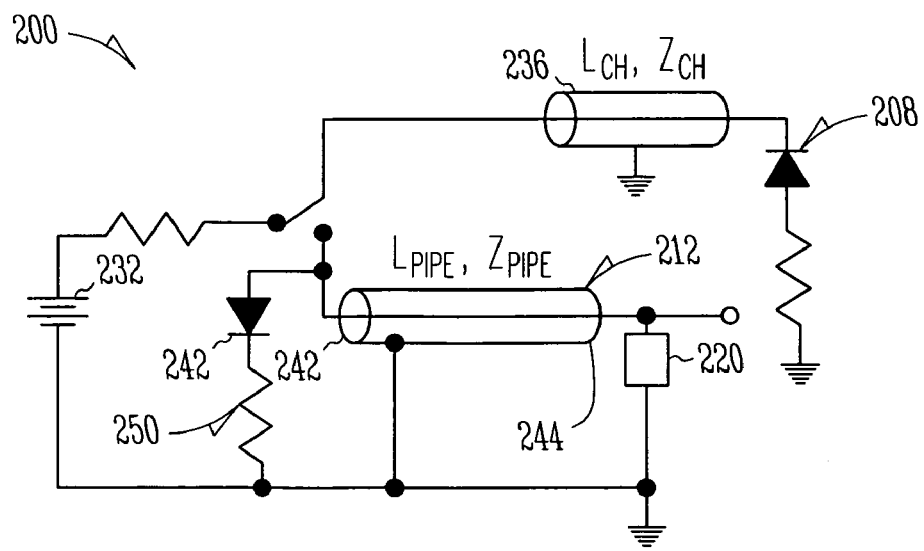
FIG. 2 is a schematic block diagram of a system according to various embodiments.

FIG. 2 is a schematic block diagram of a system 200 according to various embodiments. In this case, the trailing edge of the coupled pulse may be sharper than that obtained with the embodiment illustrated in FIG. 1. As shown, the apparatus 200 may comprise a charge line 236 coupled to a first pulse source load 208. The charge line 236 is capable of being coupled to a power source 232, including a current source, a high voltage source or a very high voltage source.

The apparatus 200 may also include a connecting line 212 having a first end 242 DC-coupled to a second end 242. The connecting line 212 is capable of being coupled to an output load 220, such as a device under test, which may comprise an integrated circuit, as is also the case in FIG. 1.

The apparatus 200 may also comprise a switch 240 to couple the charge line 236 to the first end 242 when in a first position, and to decouple the charge line 236 from the first end 242 when in a second position. The connecting line 212 may have a selected impedance (e.g., $Z_{pipe}$) based on a resistance of the switch (e.g., $R_{sw}$) and an impedance of the charge line (e.g., $Z_{ch}$).

As noted previously, the system 200 may further comprise a second pulse source load 250 capable of being coupled to the first end 242 of the connecting line 212. This second pulse source load 250 may comprise a polarized load, such as a PML, and may be similar to or identical to the first pulse source load 208. The impedance of the second pulse source load 250 may be selected so as to be substantially equal to the selected impedance (e.g., $Z_{pipe}$) of the connecting line 212. Alternatively, or in addition, the impedance of the charge line (e.g., $Z_{ch}$) may be substantially equal to the resistance (e.g., $R_{sw}$) of the switch 240 plus about half of the selected impedance (e.g., $Z_{pipe}$) of the connecting line 212.

Figure 3:
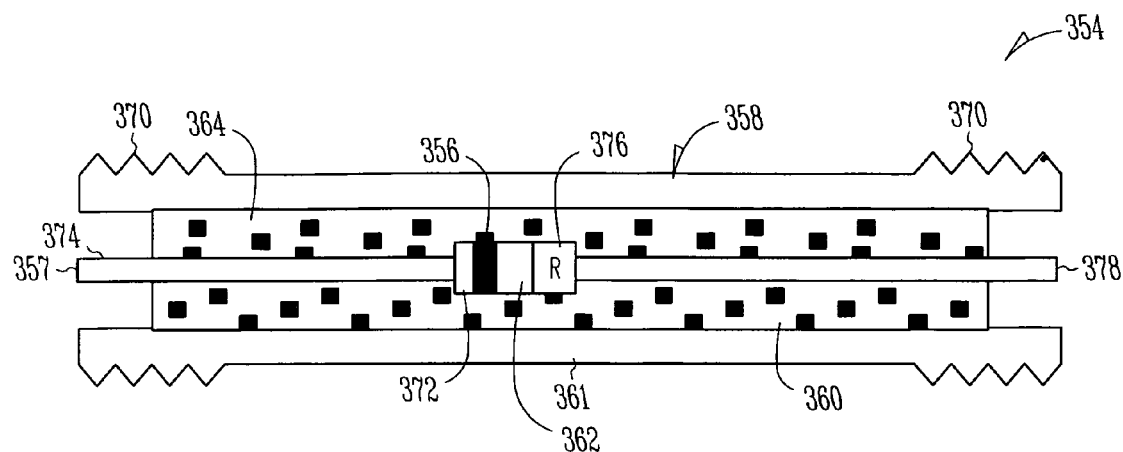
FIG. 3 is a side, cut-away view of an apparatus according to various embodiments.

Other embodiments may also be implemented. For example, FIG. 3 is a side cut-away view of an apparatus 354 according to various embodiments. A diode 356 may be inserted into, and made a part of, the center conductor 357 of a 50 ohm or 75 ohm (or any other desired line impedance value) coaxial cable 358. As shown in FIGS. 1 and 2, the apparatus 354, followed by the resistive termination (e.g., see resistor 128 in FIG. 1), can be used in place of the loads 108, 208, and/or 250.

The diode 356 may be similar to or identical to a p-i-n diode, commonly used to steer microwave signals, or may be similar to or identical to a tunnel diode. The diode 356 may have a low capacitance (e.g., less than about 4 pF) and a reverse bias rating of greater than about 2 kV, while maintaining a relatively low forward resistance (e.g., less than about 5 ohms). The ultimate forward resistance value of the diode 356 should preferably be reached within less than about 50 nsec after the switch (see elements 140, 240 in FIGS. 1 and 2, respectively) is closed, or within a time which is small compared with the pulse length (e.g., less than about 1/10 of the pulse length). Preferably, the inner diameter 360 of the outer conductor 361 is greater than the outer diameter 362 of the diode body so that there is an approximate impedance match across the length of the diode 356. Mismatches in the dielectric constant can be compensated by using steps in the dielectric 364 and a grounded outer conductor 361 where the diode 356 is located, in a manner known to those skilled in the art of designing coaxial transmission lines. Coaxial fittings 370 may be added at either end of the coaxial line 357 to form a part of the apparatus 354. The diode 356 may be constructed so that the matching resistance in the load (e.g., the resistance 128 in the pulse source load 108) is adjacent or included in the diode 356 itself, and no extra resistance is needed to make an operational PML.

Thus, an apparatus 354 may comprise a coaxial line 358 having a center conductor 357 separated from an outer conductor 361 by a dielectric 364. The apparatus 354 may include a diode 356 having an anode 372 coupled to a first end 374 of the center conductor 357 and a cathode 376 coupled to a second end 378 of the center conductor 357. The apparatus 354 may also comprise a resistance R coupled in series with the diode 356, wherein the resistance R is substantially equal to a selected matching termination resistance (e.g., about 50 ohms). The resistance R may be included as an integral part of the diode 356.

Figure 4:
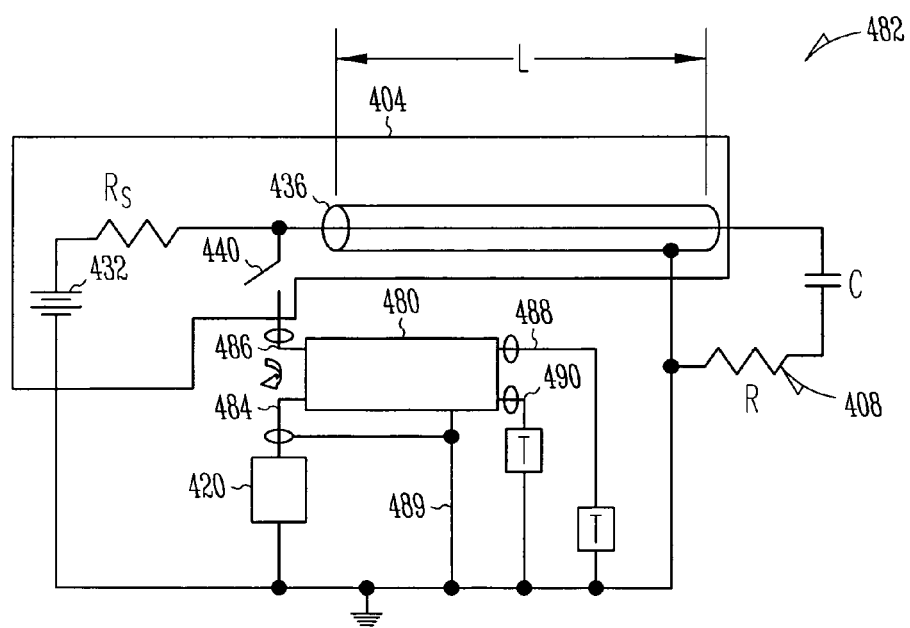
FIG. 4 is a schematic block diagram of an apparatus and system according to various embodiments.

Other embodiments are possible. FIG. 4 is a schematic block diagram of an apparatus 480 and system 482 according to various embodiments. As shown, short, CDM-like pulses may be produced by a pulse source 404, which may be an impedance-matched pulse source. A coupling apparatus 480, which can be a quarter-wave, single-section microwave directional coupler, may be used to receive regular TLP pulses from the pulse source 404. Such TLP pulses may be greater than about 50 nanoseconds long, such that a coupling apparatus 480 having a center frequency $f_0$ of 500 MHz or higher can operate to differentiate the leading edge of the main input pulse, giving a short voltage/current spike on the output port 484, much like a true CDM event. This is because the voltage $V_{coupled}$ arising at the output port 484 of a quarter wave directional coupler relates to the input voltage $V_{in}$ presented to the input port 486 approximately as:

$$\frac{V_{coupled}}{V_{in}} = \frac{jk\sin\theta}{\sqrt{1-k^2}\cos\theta + j\sin\theta}.$$

The electrical length $\theta = \omega l/c$, where c is the propagation velocity, l is the physical length and k the coupling coefficient, $$\left(k = \frac{Z_{oe} - Z_{oo}}{Z_{oe} + Z_{oo}},\right.$$

where $Z_{oe}$ and $Z_{oo}$ are the even and odd mode impedances of the apparatus 480), and the system impedance $Z_0 = \sqrt{Z_{oo}Z_{oe}}$. For low frequencies, $V_{coupled}$ may vary as $j\omega/\omega_0$, and the coupling apparatus 480 may differentiate the signal $V_{in}$ without any phase differences. In the time domain, the rise time of the TLP pulse voltage at the input port 486 should be twice the transit time over the quarter-wave section, or $1/(2*f_0)$. The rise time should not be slower than this; if the TLP rise time is faster, the rise time can more easily be preserved and the coupler 480 may better regulate the width of the pulse.

Preferably, the coupling apparatus 480 should operate to reduce the input voltage $V_{in}$ by 3 db or less. Use of such a coupling apparatus 480 can turn the leading edge of the TLP input pulse into a fast, CDM-like current spike. The coupling apparatus may include a thru port 488 and an isolated port 490; each may be terminated with 50 ohm loads.

For example, the isolated port 490 or the thru port 488 may be coupled to an impedance-matched cable, such as a 50 ohm oscilloscope input to view reflections in the coupling apparatus 480. A resistive-capacitive (RC) termination, such as the pulse source load 408 may help reduce echo pulses of opposite polarity by providing voltage decay. Extra energy stored on the capacitor C (e.g., 0.01 uF) may be dissipated, so it is wise to use high-wattage values for R and other termination resistors in the system 482, particularly the thru port 488. While an SPST switch 440 is shown, SPDT switches can also be used (as shown in FIGS. 1 and 2), reducing the likelihood of recharge pulses.

The coupling apparatus 480 should provide strong coupling to the TLP input pulse, 50-ohm compatibility, tolerance for high voltage and very high voltage pulses (e.g., greater than 100 volts potential, and including thousands of pulsed volts on the input port 486), and impedance matching of the primary TLP pulse and of pulses reflected from an unmatched output load 420 (e.g., a device under test). Relatively long transmission lines (included in the charge line 436) and RC terminations, such as pulse source loads 408 can be used, rather than a simple RC termination directly on the switch 440, in order to utilize the dispersion and dissipation provided by a long cable. In such applications, more dispersion and dissipation, rather than less, are typically desired. The length L of the charge line 436 may be selected such that the pulse being fed to the coupling apparatus 480 is greater than about one hundred nanoseconds long, e.g., 10-20 meters of 50 ohm coaxial cable.

The coupling apparatus 480 may be similar to or identical to those available from RLC Electronics of Mt. Kisco, N.Y., such as a 3 db (k=0.71) hybrid stripline coupler tolerating pulses of at least about 3.5 kV, including a model RLC H-1036 3 db coupler having an $f_0$=750 MHz. Higher frequencies may be used, such as a $f_0$=2.5 GHz. but the strength of the coupled pulse may be limited by the switch 440 arc behavior and voltage limits. A commercial impulse noise simulator, similar to or identical to those available from Noise Laboratory Company, Ltd. (i.e., NoiseKen), such as the Model INS-4001, which includes charged transmission lines, can be used for the pulse source 404. A high-pressure gas relay switch may be used for the switch 440.

Thus, a system 482 may comprise a pulse source 404 (including a current source, a high voltage source, or a very high voltage source) and a coupling apparatus 480 having an input port 486 capable of being coupled to the pulse source 404, a thru port 488 capable of being coupled to a first termination load T, and an output port 484 capable of being coupled to an output load 420 (e.g., a device under test, perhaps comprising an integrated circuit). The coupling apparatus may be coupled to ground by way of a return terminal 489.

The pulse source 404 may comprise a charge line 436, and may be coupled to a pulse source load 408. The charge line 436 may be coupled to a power source 432, including a high voltage source or a very high voltage source. Rs, the source resistance, should be a relatively high resistance, such as about 500 ohms or greater.

The system 482 may also comprise a switch 440 to couple the input port 486 to the charge line 436 in a first position, and to decouple the input port 486 from the charge line 436 in a second position. As noted above, the switch 440 may comprise an SPST switch, wherein the charge line 436 remains coupled to the pulse source 404 when the switch 440 is in either the first position or the second position. Alternatively, as shown in the examples of FIGS. 1 and 2, the switch 440 may comprise an SPDT switch, wherein the switch 440 is to couple the charge line 436 to the power source 432 when the switch 440 is in the second position.

The coupling apparatus 480 may have an impedance that is substantially equal to a resistance of the switch 440 plus an impedance of the charge line 436. The pulse source load 408 may comprise a PML. As shown in FIG. 4, the pulse source load 408 may also comprise a resistance R in series with a capacitance C. In some embodiments, the pulse source load 408 may comprise a microwave frequency DC block C and a heavy-duty matched load R. This type of coupling may obviate the use of the charge line 436, such that a system 482 may comprise a pulse source 404 capable of being coupled to a microwave DC block C coupled to a matching load R. In this case, the pulse source may comprise a power source 432, including a high voltage source and/or a matching resistor R. This system 482 may also comprise a coupling apparatus 480 having an input port 486, as well as a thru port 488 and isolated port 490, each coupled to a termination load T, and an output port 484 coupled to an output load 420 (e.g., a device under test). This system 482 may also include a switch 440 to couple the input port 486 to the pulse source 404 when in a first position, and to decouple the input port 486 from the pulse source 404 when in a second position. A pulse load 408 may comprise a resistance R in series with the microwave DC block C. The resistance R may terminate an impedance of the pulse source 404, which may be substantially equal to an impedance of the charge line (e.g., $Z_{ch}$).

Figure 5A:
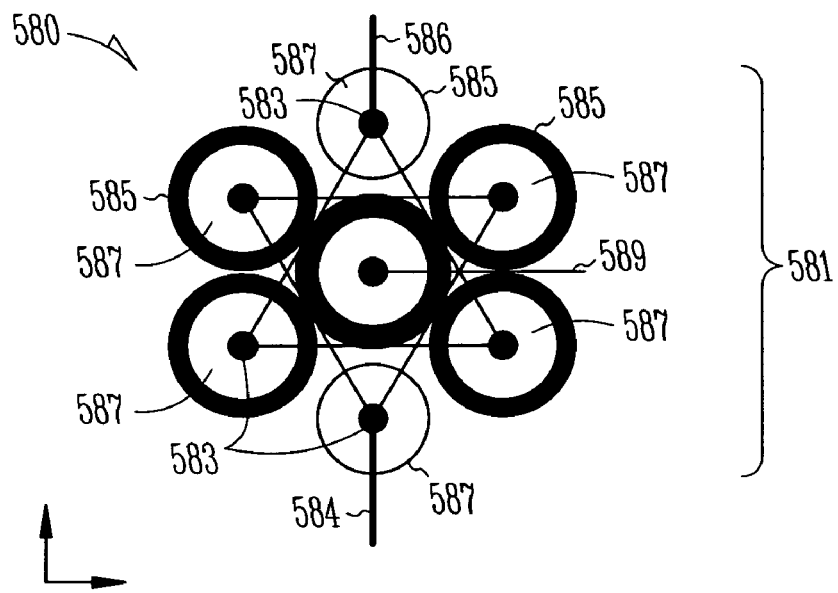
FIGS. 5A and 5B are front and back views, respectively, of an apparatus according to various embodiments.
Figure 5B:
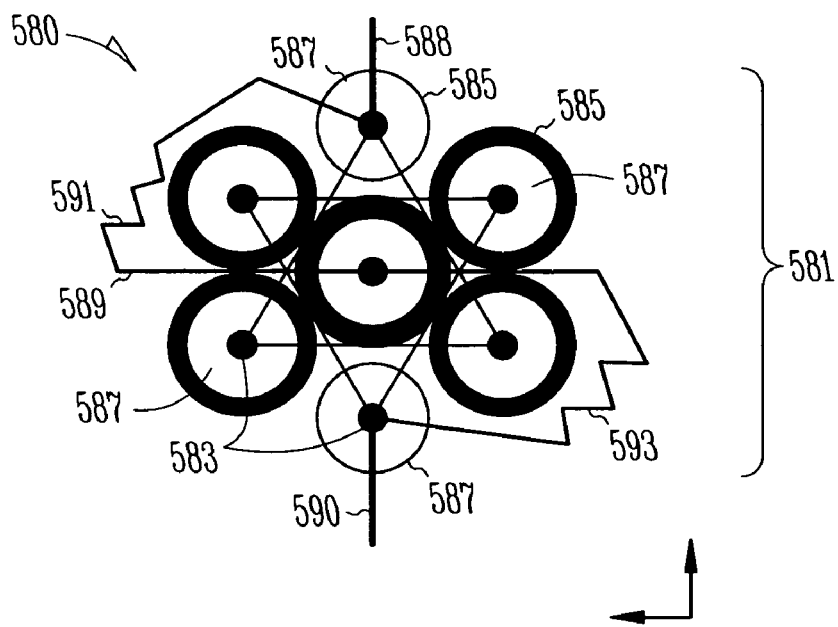

The coupling apparatus 480 may be implemented in many different ways. For example, FIGS. 5A and 5B are front and back views, respectively, of an apparatus 580 according to various embodiments. The apparatus 580 may comprise, for example, a plurality of substantially parallel transmission lines 581, which may be located substantially adjacent each other, and each may have a center conductor 583 separated from a shield 585 by a dielectric 587. Each one of the shields 585 may be coupled together.

A first one of the plurality of substantially parallel transmission lines 581 may have a first end coupled to an input port 586 and a second end coupled to a thru port 588. A second one of the plurality of substantially parallel transmission lines 581 may have a first end coupled to an output port 584 and a second end coupled to an isolated port 590. A third one of the plurality of substantially parallel transmission lines 581 may have a first end coupled to an input port 586 and a second end coupled to a thru port 588. A fourth one of the plurality of substantially parallel transmission lines 581 may have a first end coupled to an output port 584 and a second end coupled to an isolated port 590. A fifth one of the plurality of substantially parallel transmission lines 581 may have a first end coupled to an input port 586 and a second end coupled to a thru port 588. A sixth one of the plurality of substantially parallel transmission lines 581 may have a first end coupled to an output port 584 and a second end coupled to an isolated port 590. A seventh one of the plurality of substantially parallel transmission lines 581 may have a first end and a second end coupled to a return terminal 589 (which may be grounded). An eighth one (not shown) of the plurality of substantially parallel transmission lines 581 may have a first end and a second end coupled to the return terminal 589.

A first selected matching resistance 591 (e.g., 50 ohms of resistance) may be coupled between the return terminal 589 and the thru port 588. A second selected matching resistance 593 (e.g., 50 ohm resistance), which may be substantially equal to the first selected matching resistance 591 may be coupled between the return terminal 589 and the isolated port 590. The first selected matching resistance 591 and the second selected matching resistance 593 may be included in and provided by impedance-matched cables 581 coupled to the thru port 588 and to the isolated port 590, respectively.

Thus, the apparatus 580 may be described as comprising a first group of substantially parallel transmission lines 581 having a first end coupled to the input port 586 and a second end coupled to the thru port 588, as well as a second group of substantially parallel transmission lines 581 having a first end coupled to the output port 584 and a second end coupled to the isolated port 590. The plurality of substantially parallel transmission lines 581 may comprise 52 ohm and 75 ohm coaxial cable (or any other characteristic impedance), such as Belden 9311, 9259, and/or 8241 cable, or any combination of these. For example, the first, third and fifth ones of the plurality of substantially parallel transmission lines 581 may comprise two 52 ohm and one 75 ohm coaxial cables. In addition, the second, fourth and sixth ones of the plurality of substantially parallel transmission lines 581 may comprise two 52 ohm and one 75 ohm coaxial cables. The seventh (ground return) and optional eighth cables may each comprise a 75 ohm coaxial cable.

Knowing the speed of propagation on the coaxial cable, the length of the substantially parallel transmission lines may be selected so as to give a desired quarter wave center frequency $f_0$, as described above. For improved performance, the propagation speed on all cables should be matched (e.g., 66% of the speed of light). The choice of impedance for the parallel cables and the ground return cable is driven by the resulting even and odd mode impedances Zoe and Zoo as discussed earlier, plus the desired system impedance $Z_0$, which may be 50 ohms. The use of a single ground return cable instead of two may be to compensate for the effect of the floating shield on impedance match while retaining strong coupling between input and output.

In some embodiments, it may be beneficial to include some number of half-twists in one or more selected lines included in the plurality of substantially parallel transmission lines 581. For example, the first group of substantially parallel transmission lines and the second group of substantially parallel transmission lines may each include an odd multiple of one-half twists (e.g., one, three, or five half-twists). Adding some odd number of half-twists to the configurations illustrated may result in locating the thru port 588 where the isolated port 590 is shown, and in locating the isolated port 590 where the thru port 588 is shown. As depicted in FIGS. 5A and 5B, the seventh one of the plurality of substantially parallel transmission lines 581 may be substantially surrounded by the first one and the second one of the plurality of substantially parallel transmission lines 581, as well as the first group and the second group of substantially parallel transmission lines 581.

Figure 6A:
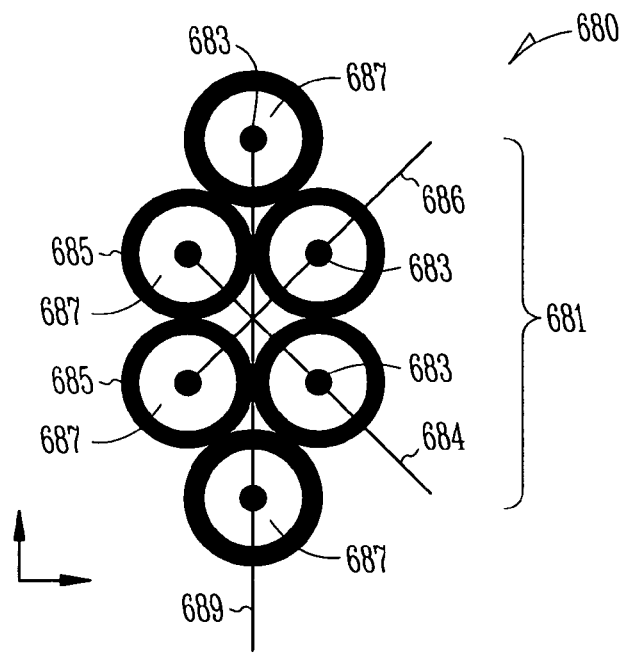
FIGS. 6A and 6B are front and back views, respectively, of an apparatus according to various embodiments.
Figure 6B:
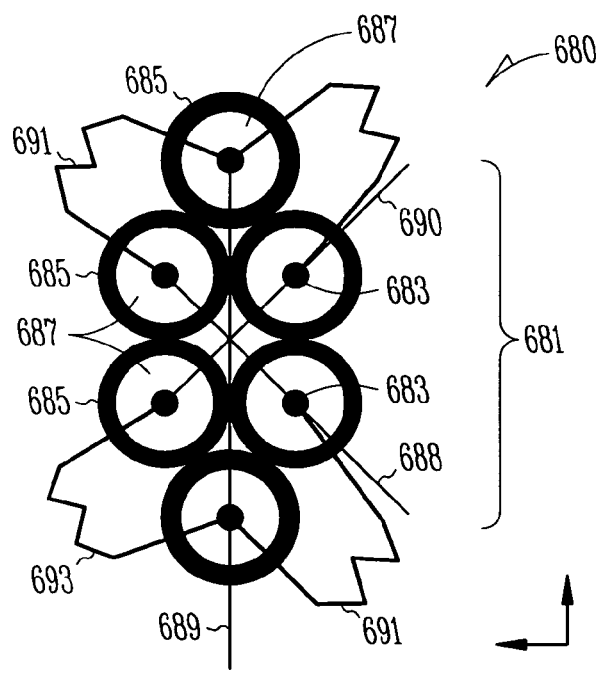

Still further embodiments may be implemented. For example, FIGS. 6A and 6B are front and back views, respectively, of an apparatus 680 according to various embodiments. The apparatus 680 may comprise a plurality of substantially parallel transmission lines 681, which may be substantially adjacent each other, and each may have a center conductor 683 separated from a shield 685 by a dielectric 687. Each one of the shields 685 may be coupled together. A first one of the plurality of substantially parallel transmission lines 681 may have a first end coupled to an input port 686 and a second end coupled to a thru port 688. A second one of the plurality of substantially parallel transmission lines 681 may have a first end coupled to an output port 684 and a second end coupled to an isolated port 690. A third one of the plurality of substantially parallel transmission lines 681 may have a first end and a second end coupled to a return terminal 689. A fourth one of the plurality of substantially parallel transmission lines 681 may have a first end coupled to the input port 686 and a second end coupled to the thru port 688. A fifth one of the plurality of substantially parallel transmission lines 681 may have a first end coupled to the output port 684 and a second end coupled to the isolated port 690. A sixth one of the plurality of substantially parallel transmission lines may have a first end and a second end coupled to the return terminal 689. The plurality of substantially parallel transmission lines 681 may comprise 50 ohm (for input and output lines) and 75 ohm (for ground returns) coaxial cable (or any other characteristic impedance), such as Belden 8259, 9259, and/or 8241 cable, or any combination of these. For example, the first, second, fourth, and fifth ones of the plurality of substantially parallel transmission lines 681 may comprise one each of a 50 ohm (or any other characteristic impedance) coaxial cable. In addition, the third and sixth ones of the plurality of substantially parallel transmission lines 681 may comprise one each of a 75 ohm coaxial cable (or any other characteristic impedance).

A first selected matching resistance 691 (e.g., about 50 ohms of resistance) may be coupled between the return terminal 689 and the thru port 688, and a second selected matching resistance 693, which may be substantially equal to the first selected matching resistance 691 (e.g., about 50 ohms of resistance) may be coupled between the return terminal 689 and the isolated port 690. The first selected matching resistance 691 and the second selected matching resistance 693 may be included in and provided by impedance matched cables coupled to the thru port 688 and to the isolated port 690, respectively.

The apparatus 680 can be constructed so as to have a 50-ohm system impedance and k=0.6 (4.4 db), using approximately 50 ohm and 75 ohm coaxial cable (preferably, the propagation velocity in each cable is substantially matched, with c=0.66 light speed). The apparatus 680 can be made using two 100-ohm sections in parallel, or a single 100 ohm section may be useful for 100 ohm twisted pair applications. Using two symmetrical 100-ohm sections (e.g., using 100 ohm parallel resistors 691, 693), upper and lower, determining the behavior of the apparatus 680 according to equations known to those of skill in the art, $Z_{oe}$=200 ohms, $Z_{oo}$=50 ohms, $Z_0$ of each half of the apparatus 680 is 100 ohms, and the final system $Z_0$=50 ohms. The connections shown in FIGS. 6A and 6B may distribute currents traveling in the center conductors 683 substantially equally on each half of the coupler 680. Because of the fairly strong coupling (about k=0.6 or 4.4 db) that can be achieved, a substantial amount of the impressed voltage at high frequency is transmitted to the output port 684, as desired. The length of the plurality of substantially parallel transmission lines 681 may be about 5 cm and 10 cm for 1 GHz and 500 MHz center frequencies ($f_0$), respectively. The shields 685 may be shorted together, and left to float.

Unlike the traditional re-entrant coupler designs, not all of the fields between the shields 685 and the ground return 689 may be captured inside the physical confines of the apparatus 680, so there can be some influence due to the external fields. However, if one of the connections from the center conductors 683 to the return terminal 689 is removed (i.e., using one return cable instead of two), better impedance-matching can result.

Figure 7:
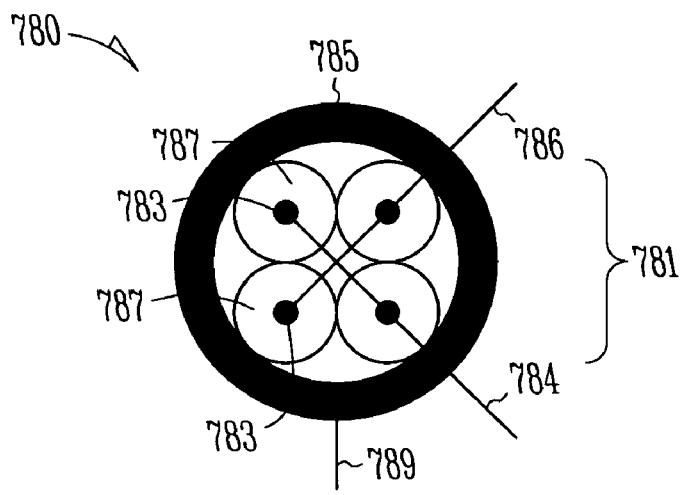
FIG. 7 is a front view of an apparatus according to various embodiments.

FIG. 7 is a front view of an apparatus according to various embodiments. In this alternative embodiment, an apparatus 780 may comprise a plurality of substantially parallel transmission lines 781, wherein each line may be substantially adjacent the other lines, and wherein each line may have a center conductor 783 surrounded by a dielectric 787, which may be adjacent to a shield 785 coupled to a return terminal 789. A first one of the plurality of substantially parallel transmission lines 781 may have a first end coupled to an input port 786 and a second end coupled to a thru port (not shown, but similar to that illustrated in FIG. 6B). A second one of the plurality of substantially parallel transmission lines 781 may have a first end coupled to an output port 784 and a second end coupled to an isolated port (not shown, but similar to that illustrated in FIG. 6B).

Referring to FIGS. 6A, 6B, and 7, it should be noted that the input port may be located adjacent the output port, and the thru port may be located adjacent the isolated port. The input port may be DC coupled to the thru port, and the output port may be DC coupled to the isolated port. The shield may be a substantially continuous shield (e.g., greater than about 80% shielding coverage) surrounding the plurality of substantially parallel transmission lines, similar to or identical to the shielding applied to cover the dielectric in conventional coaxial cables. The shield may also be a sparse shield (e.g., less than about 70% shielding coverage) surrounding the plurality of substantially parallel transmission lines.

Figure 8:
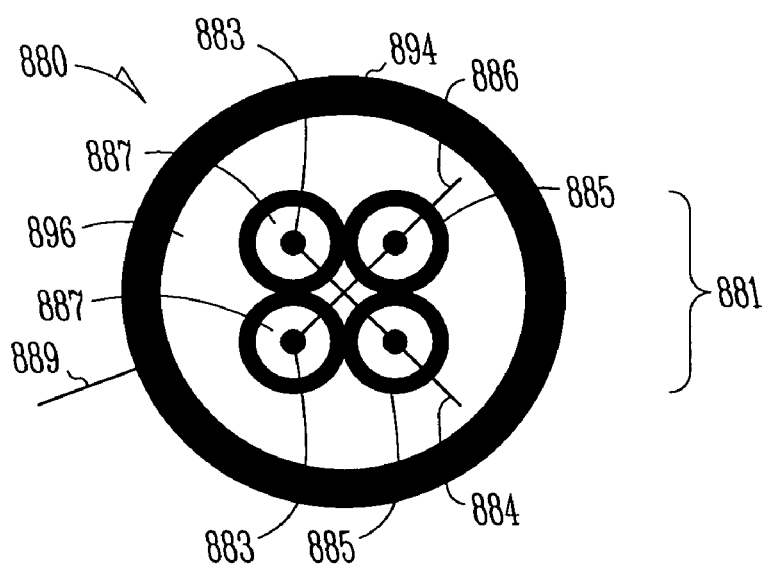
FIG. 8 is a front view of an apparatus according to various embodiments.

FIG. 8 is a front view of an apparatus according to various embodiments. In this case, the apparatus 880 may comprise a plurality of substantially parallel transmission lines 881, each having a center conductor 883 surrounded by a first dielectric 887, which may be adjacent a first shield 885. As seen in previous figures, each one of the plurality of substantially parallel transmission lines 881 may be substantially adjacent the others. A first one of the plurality of substantially parallel transmission lines 881 may have a first end coupled to an input port 886 and a second end coupled to a thru port (not shown, but similar to that illustrated in FIG. 6B). A second one of the plurality of substantially parallel transmission lines 881 may have a first end coupled to an output port 884 and a second end coupled to an isolated port (not shown, but similar to that illustrated in FIG. 6B).

A second shield 894, which may be a substantially continuous shield, or a sparse shield, may surround a second dielectric 896, which may in turn substantially surround the plurality of substantially parallel transmission lines 881. As noted above, each one of the plurality of substantially parallel transmission lines 881 may in turn be surrounded by an individual shield 885. The second dielectric 896 may have a dielectric constant substantially equal to the dielectric constant of the first dielectric 887. Either the first shield 885, or the second shield 894, or both, may be coupled to a return terminal 889.

It should be understood that the apparatus and systems of various embodiments can be used in applications other than for CDM testing, and thus, the embodiments described herein are not to be so limited. The illustrations of various apparatus and systems are intended to provide a general understanding of the structure of various illustrated embodiments, and they are not intended to serve as a complete description of all the elements and features of apparatus and systems that might make use of the structures described herein.

Applications that may include the novel apparatus and systems of various embodiments include electronic circuitry used in high-speed computers, communication and signal processing circuitry, data transceivers, modems, processor modules, embedded processors, and application-specific modules, including multilayer, multi-chip modules. Such apparatus and systems may further be included as sub-components within a variety of electronic systems, such as televisions, cellular telephones, personal computers, workstations, radios, video players, vehicles, and others.

Figure 9:
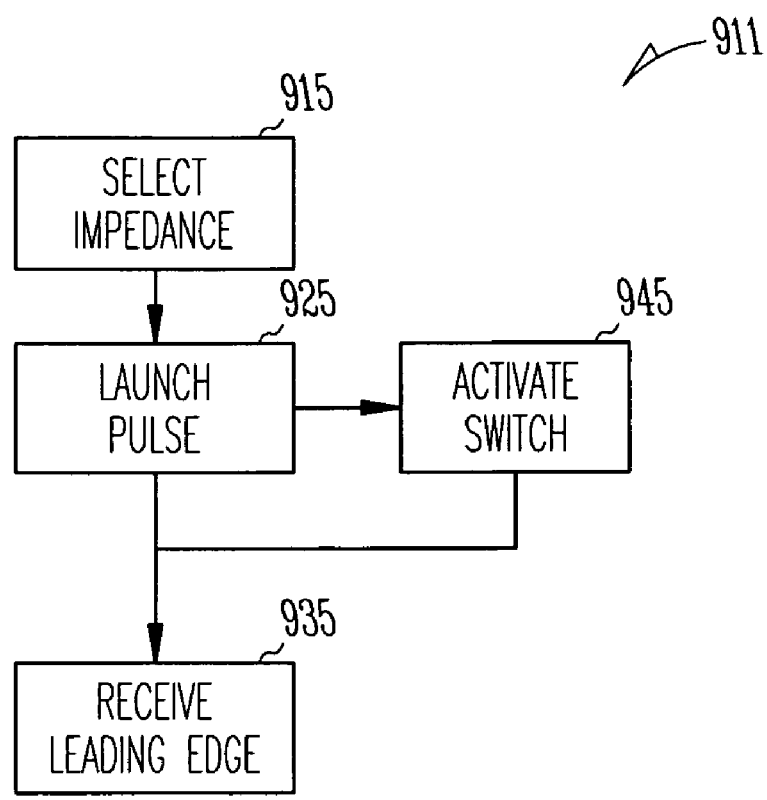
FIG. 9 is a flow chart illustrating several methods according to various embodiments.

Some embodiments include a number of methods. For example, FIG. 9 is a flow chart illustrating several methods according to various embodiments. In some embodiments, a method 911 may (optionally) begin with launching a pulse into an input port of a quarter-wave directional coupler having an impedance-matched thru port and an isolated port at block 925. The method 911 may continue with receiving a leading edge of the pulse as a voltage spike at an output port of the coupler at block 935. In some embodiments, the quarter-wave directional coupler may have a center frequency that is greater than about 100 MHz. Launching the pulse into the input port of the quarter-wave directional coupler at block 925 may further comprise activating a switch to couple a pulse source to the input port at block 945.

The method 911 may also include selecting an impedance of the quarter-wave directional coupler by matching an impedance of the quarter-wave directional coupler to a sum of a resistance of the switch and an impedance of a charge line included in the pulse source at block 915. Alternatively, or in addition, the method 911 may include selecting an impedance of the quarter-wave directional coupler such that a sum of the impedance of the quarter-wave directional coupler and a resistance of the switch is less than or substantially equal to an impedance of a charge line included in the pulse source at block 915. In each case, the quarter-wave directional coupler may be implemented as described in FIGS. 1-2 and 4-8 with respect to elements 112, 212, 480, 580, 680, 780, and 880.

It should be noted that the methods described herein do not have to be executed in the order described, or in any particular order. Moreover, various activities described with respect to the methods identified herein can be executed in serial or parallel fashion.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description.

The various embodiments contemplated by this disclosure include any other applications in which the above structures and methods can be used. Therefore, the scope of the claims below should be determined with reference to the various embodiments, along with the full range of equivalents to which such claims are entitled.

It is emphasized that the Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

What is claimed is:

1. A system, comprising:
   a charge line coupled to a first pulse source load and capable of being coupled to a power source;
   a connecting line having a first end DC-coupled to a second end capable of being coupled to an output load; and
   a switch to couple the charge line to the first end when in a first position, and to decouple the charge line from the first end when in a second position, wherein the connecting line has a selected impedance based on a resistance of the switch and an impedance of the charge line, and wherein the selected impedance is substantially equal to a sum of a resistance of the switch and an impedance of the charge line.

2. The system of claim 1, wherein the switch resistance comprises a switch arc resistance.

3. The system of claim 1, wherein the switch comprises a single-pole, single-throw switch, and wherein the charge line remains coupled to the power source when the switch is in either the first position or the second position.

4. The system of claim 1, wherein the first pulse source load comprises a polarized matching load.

5. The system of claim 1, further comprising:
   a second pulse source load capable of being coupled to the first end of the connecting line.

6. The system of claim 5, wherein the second pulse source load comprises a polarized load.

7. The system of claim 5, wherein an impedance of the second pulse source load is substantially equal to the selected impedance.

8. A system, comprising:
   a charge line coupled to a first pulse source load and capable of being coupled to a power source;
   a connecting line having a first end DC-coupled to a second end capable of being coupled to an output load; and
   a switch to couple the charge line to the first end when in a first position, and to decouple the charge line from the first end when in a second position, wherein the connecting line has a selected impedance based on a resistance of the switch and an impedance of the charge line, wherein a sum of the selected impedance and the resistance of the switch is less than or substantially equal to an impedance of the charge line.

9. The system of claim 8, wherein the switch comprises a single-pole, single-throw switch, and wherein the charge line remains coupled to the power source when the switch is in either the first position or the second position.

10. The system of claim 8, wherein the first pulse source load comprises a polarized matching load.

11. The system of claim 8, wherein a second pulse source load comprises a polarized load.

12. The system of claim 8, wherein an impedance of a second pulse source load is substantially equal to the selected impedance.

13. A system, comprising:
    a charge line coupled to a first pulse source load and capable of being coupled to a power source;
    a connecting line having a first end DC-coupled to a second end capable of being coupled to an output load; and
    a switch to couple the charge line to the first end when in a first position, and to decouple the charge line from the first end when in a second position, wherein the connecting line has a selected impedance based on a resistance of the switch and an impedance of the charge line, wherein the switch comprises a single-pole double-throw switch, and wherein the switch is to couple the charge line to the power source when the switch is in the second position.

14. The system of claim 13, wherein the switch comprises a single-pole, single-throw switch, and wherein the charge line remains coupled to the power source when the switch is in either the first position or the second position.

15. The system of claim 13, wherein the first pulse source load comprises a polarized matching load.

16. The system of claim 13, wherein a second pulse source load comprises a polarized load.

17. The system of claim 13, wherein an impedance of a second pulse source load is substantially equal to the selected impedance.

18. A system, comprising:
    a charge line coupled to a first pulse source load and capable of being coupled to a power source;
    a connecting line having a first end DC-coupled to a second end capable of being coupled to an output load;
    a switch to couple the charge line to the first end when in a first position, and to decouple the charge line from the first end when in a second position, wherein the connecting line has a selected impedance based on a resistance of the switch and an impedance of the charge line; and
    a second pulse source load capable of being coupled to the first end of the connecting line, wherein the impedance of the charge line is substantially equal to the resistance of the switch plus about half of the selected impedance.

* * * * *